US006624678B1

(12) United States Patent
Boutaud et al.

(10) Patent No.: US 6,624,678 B1
(45) Date of Patent: Sep. 23, 2003

(54) SCHMITT TRIGGER DEVICE WITH DISABLE

(75) Inventors: Frederic Boutaud, Belmont, MA (US); Sean M. FitzPatrick, Westford, MA (US); Paul D. Krivacek, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/267,796

(22) Filed: Oct. 9, 2002

(51) Int. Cl.[7] .............................................. H03K 3/037
(52) U.S. Cl. ....................................................... 327/206
(58) Field of Search ................................. 327/205, 206, 327/208, 210, 219, 185, 389; 326/26, 27, 57

(56) References Cited

U.S. PATENT DOCUMENTS

| 3,984,703 | A | | 10/1976 | Jorgensen | .................... 327/206 |
|---|---|---|---|---|---|
| 5,594,361 | A | * | 1/1997 | Campbell | .................... 326/24 |
| 6,046,617 | A | * | 4/2000 | Hoeld | ........................ 327/206 |
| 6,388,488 | B1 | * | 5/2002 | Ho | ............................. 327/206 |
| 6,448,830 | B1 | * | 9/2002 | Chuang et al. | ............. 327/205 |

* cited by examiner

Primary Examiner—My-Trang Nu Ton
(74) Attorney, Agent, or Firm—Samuels, Gauthier & Stevens, LLP

(57) ABSTRACT

Described is a Schmitt trigger cell that can be disabled under conditions of unknown gate voltages (e.g., floating or toggling input) such that the core is isolated from the Schmitt trigger input. This is accomplished by circuitry that disables current flow through those transistors whose gate voltages are unknown during such conditions and that forces a known output onto the output terminal.

11 Claims, 1 Drawing Sheet

SCHMITT TRIGGER DEVICE WITH DISABLE

BACKGROUND OF THE INVENTION

The invention relates to the field of CMOS Schmitt trigger cells, and in particular to a CMOS Schmitt trigger cell with a disable function.

It is common to need to know when a signal crosses a predetermined level. Schmitt triggers are one type of circuit used in such applications. A Schmitt trigger is advantageous for such applications because its output depends on the input signal and on its recent history (i.e., it exhibits hysteresis). Thus, noisy input signals do not cause multiple transitions in the output as the input crosses the trigger point. Rather, the spurious effects of the input must be greater than the threshold difference to cause a transition in the output.

Schmitt trigger cells used in an integrated circuit (IC) typically have an input stage that is a Schmitt trigger and an output buffer stage. In most ICs, the input stage is powered by the I/O voltage, $V_{I/O}$, and the output buffer stage is powered by the core voltage, $V_{core}$. In this case, in addition to acting as a buffer, the output stage also provides a level shifting function to shift the Schmitt trigger output from the $V_{I/O}$ domain to the $V_{core}$ domain.

Standard Schmitt trigger cells consume power under various conditions. For example, Schmitt trigger cells consume power if the input to the Schmitt trigger is allowed to float or if the input is a toggling input. Low power designs, however, require controlled current flow in all transistors. Thus, a Schmitt trigger cell that can be disabled during such conditions would be advantageous for low power designs.

SUMMARY OF THE INVENTION

One aspect of the present invention provides for a Schmitt trigger cell having a Schmitt trigger circuit with an input and an output; and an output buffer circuit having an output terminal, and an input that is connected to the output of the Schmitt trigger circuit. A disable transistor is connected to the Schmitt trigger circuit and output buffer circuit such that current flow can be disabled through those transistors of the Schmitt trigger circuit, and the output buffer circuit, under conditions of unknown gate voltages. Examples of such conditions wherein gate voltages are unknown include, but are not limited to, floating input or toggling input. A transistor is also connected to the output buffer circuit such that a known output can be forced onto the output terminal.

Another aspect of the present invention provides a method of disabling a Schmitt trigger cell during unknown gate voltage conditions (e.g., floating or toggling input). Current flow is disabled through those transistors of the Schmitt trigger cell whose gate voltages are unknown due to such input conditions. A known output is also forced onto the output terminal.

DETAILED DESCRIPTION OF THE INVENTION

Figure 1:
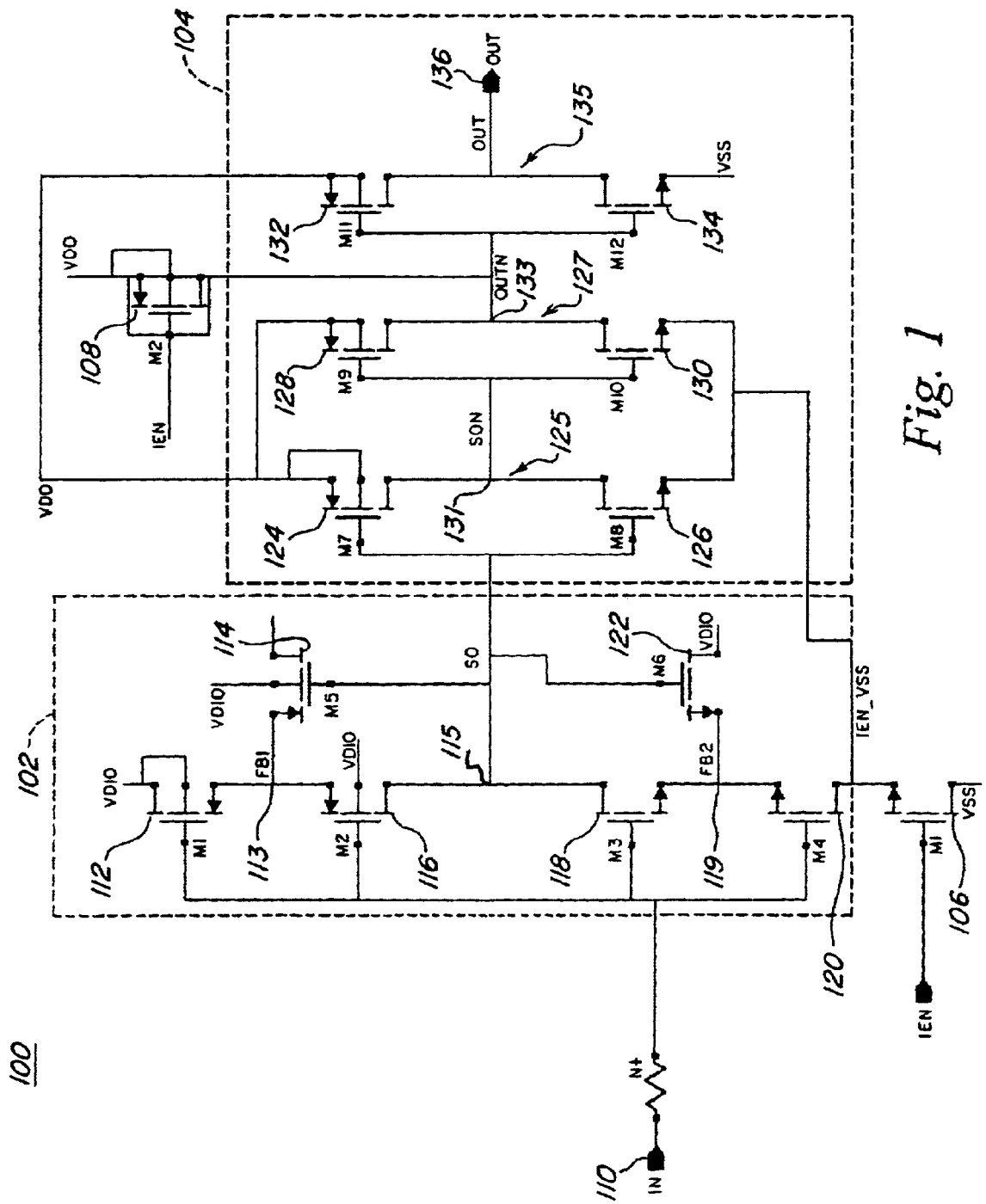
FIG. 1 illustrates a Schmitt trigger cell according to the present invention.

Throughout the specification, the present invention's Schmitt trigger cell and the present invention's method for disabling the Schmitt trigger cell are both described under floating input conditions. It should, however, be noted that the present invention is equally applicable under other conditions wherein the gate voltages are unknown. Examples of such conditions include, but are not limited to, floating inputs or toggling inputs.

FIG. 1 illustrates a Schmitt trigger cell 100 according to the present invention. Schmitt trigger cell 100 comprises a Schmitt trigger circuit 102 that is powered by the I/O voltage, and an output buffer circuit 104 that is powered by the core voltage. Schmitt trigger circuit 102 includes an input terminal 110 that receives the input signal and couples the signal to a comparator circuit comprising a p channel MOS transistor 116 and an n channel MOS transistor 118. Transistors 116 and 118 are connected in series with their drain electrodes connected together at output node 115. Trip point potentials FB1 and FB2 are coupled onto the source electrodes of the respective transistors 116 and 118 via potential divider networks consisting of a pair of p channel transistors 112 and 114, and n channel transistors 120 and 122. The low threshold reference potential FBI is coupled to the source electrode of the p channel transistor 116, whereas the high trip point potential FB2 is coupled to the source electrode of n channel transistor 118.

To form the first potential divider, P channel transistors 112 and 114 are series connected with their sources connected together at a node 113. They are series connected across a source of potential $V_{DIO}$ (i.e., the I/O voltage, $V_{I/O}$) to potential $V_{SS}$. $V_{DIO}$ is 3.3V and $V_{SS}$ is ground, for example. The low threshold reference potential FB1 is formed at node 113.

To form the second potential divider, n channel transistors 120 and 122 are series connected with their sources connected together at a node 119. The drain of transistor 122 is connected to $V_{DIO}$, while the drain of transistor 120 is connected to the source of disable transistor 106, which is an n channel MOS transistor. The drain of disable transistor 106 is connected to $V_{SS}$ and its gate is connected to a disable signal, IEN. When disable transistor 106 is on, the high threshold reference potential FB2 is formed at node 119.

P channel transistor 114 and n channel transistor 122 are each connected as source followers with the gates of the respective transistors 114 and 122 coupled to the output node 115.

Output buffer circuit 104 receives the signal SO from output node 115. The signal SO is received at output buffer circuit 104 by a level shifter comprising a pair of series connected inverters, 125 and 127. Inverter 125 comprises p channel transistor 124 and n channel transistor 126 series connected with their drains connected together, forming an output node 131. Their input gates are connected in parallel to output node 115. The source electrode of p channel transistor 124 is connected to a potential $V_{DD}$ (i.e., the core voltage, $V_{core}$). $V_{core}$ is 1.8V, for example. The source of n channel transistor 126 is connected to the source of disable transistor 106.

Likewise, inverter 127 comprises p channel transistor 128 and n channel transistor 130 series connected with their drains connected together, forming an output node 133. Their input gates are connected in parallel to the output 131 of inverter 125. The source electrode of p channel transistor 128 is connected to a potential $V_{DD}$ (i.e., the core voltage, $V_{core}$). The source of n channel transistor 126 is connected to the source of disable transistor 106.

The output 133 of the level shifter (i.e., the output of inverter 127) is fed through a buffer inverter 135 to an output terminal 136. Buffer inverter 135 comprises a pair of p and n channel transistors 132 and 134 series connected with their drains connected together, forming output terminal 136. Their input gates are connected in parallel to the output 133 of inverter 127. The source electrode of p channel transistor 132 is connected to $V_{DD}$. The source of n channel transistor 126 is connected to $V_{SS}$.

A pull-up transistor 108 has its source connected to $V_{DD}$ and its drain connected to the input of buffer inverter 135. The gate of pull-up transistor 108 is connected to the disable signal, IEN.

Schmitt trigger cell 100 is similar to the Schmitt trigger circuit described in U.S. Pat. No. 3,984,703, incorporated herein by reference. Schmitt trigger cell 100, however, has disable transistor 106 and pull-up transistor 108, which operate to disable Schmitt trigger cell 100 when float conditions are present on input 110.

During times when float conditions are not occurring, IEN is driven to a logic one, which turns disable transistor 106 on and pull-up transistor 108 off. Conversely, when float conditions are likely to occur, such as during initialization or power down, the input is disabled by driving IEN to a logic zero. This turns disable transistor 106 off and pull-up transistor 108 on. IEN is referenced to the core voltage, $V_{DD}$.

When disable transistor 106 is in the on state and pull-up transistor is in the off state (i.e., when IEN is logic one), Schmitt trigger cell 100 operates in a similar manner as the circuit described in U.S. Pat. No. 3,984,703. Schmitt trigger circuit 102 is the same as the circuit portion shown in the dotted box 24 in U.S. Pat. No. 3,984,703, except for disable transistor 106. Thus, in the case disable transistor 106 is in the on state, Schmitt trigger circuit 102 operates the same as the circuit portion shown in the dotted box 24. The output SO of Schmitt trigger circuit 102 is fed to the level shifter comprising inverters 125 and 127. After being level shifted, the signal is fed through buffer inverter 135 to output terminal 136.

When disable transistor 106 is in the off state and pull-up transistor is in the on state (i.e., when IEN is logic zero), Schmitt trigger cell 100 is disable such that the output 136 isolated from the input 110, and the current flow through the transistors is controlled. In this case, disable transistor 106 disables current flow through those transistors whose gate voltages are unknown due to the float conditions on input terminal 110. In the embodiment shown, this is accomplished by disconnecting transistors 120, 126 and 130 from VSS. At the same time, pull-up transistor 108 forces the output signal on output terminal 136 to a known state. In the embodiment shown, it does so by pulling up the input of buffer inverter 135 to a logic one. This results in a logic zero being output on output terminal 136.

Thus, when input float conditions are likely, Schmitt trigger cell 100 can be disabled such that the core is isolated from the Schmitt trigger circuit input. This is accomplished by placing the appropriate logic on signal IEN so as to disable current flow through those transistors whose gate voltages are unknown, and force a known output onto the output terminal.

The design shown is advantageous because IEN can be referenced from the core voltage. Generally, during power down and initialization, the core voltage stabilizes before the I/O voltage. Further, the design does not need a level shifter to operate disable transistor 106 using IEN. This eliminates additional circuitry.

Although the present invention has been shown and described with respect to a preferred embodiment thereof, various changes, omissions and additions to the form and detail thereof, may be made therein, without departing from the spirit and scope of the invention.

What is claimed is:

1. A Schmitt trigger cell comprising:

a Schmitt trigger circuit having an input and an output;

an output buffer circuit having an output terminal, and an input that is connected to the output of the Schmitt trigger circuit;

a disable transistor connected to the Schmitt trigger circuit and output buffer circuit such that current flow can be disabled through at least one transistor of the Schmitt trigger circuit and at least one transistor of the output buffer circuit;

a transistor connected to the output buffer circuit such that a known output can be forced onto the output terminal.

2. The Schmitt trigger cell of claim 1, wherein the Schmitt trigger circuit comprises:

an input terminal to receive an input signal and couple the input signal to gates of a first p channel transistor and a first n channel transistor, wherein the first p channel and first n channel transistors have their drain electrodes connected together at an output node;

a first potential divider to provide a low threshold reference potential on the source of the first p channel transistor, the first potential divider comprising second and third p channel transistors with their sources connected to the source of the first p channel transistor, wherein the gate of the third p channel transistor is connected to the output node; and a second potential divider to provide a high threshold reference potential on the source of the first n channel transistor, the second potential divider comprising second and third n channel transistors with their sources connected to the source of the first n channel transistor, wherein the gate of the third n channel transistor is connected to the output node.

3. The Schmitt trigger cell of claim 2, wherein:

the drain of the second p channel transistor is connected to a first potential;

the drain of the third p channel transistor is connected to a second potential;

the drain of the second n channel transistor is connected to the source of the disable transistor;

the drain of the third n channel transistor is connected to the first potential; and the source of the disable transistor is connected to the second potential.

4. The Schmitt trigger cell of claim 1, wherein the output buffer circuit comprises:

a level shifter connected to the input of the output buffer circuit to receive the output of the Schmitt trigger circuit; and a buffer inverter to receive an output from the level shifter and to provide an output on the output terminal.

5. The Schmitt trigger cell of claim 4, wherein the transistor has its source connected to a first potential and its drain connected to the input of the buffer inverter.

6. The Schmitt trigger cell of claim 4, wherein the level shifter comprises a pair of series connected inverters.

7. A Schmitt trigger cell comprising:

a Schmitt trigger circuit having an input and an output;

an output buffer circuit having an input connected to the output of the Schmitt trigger circuit, and an output terminal;

means for disabling current flow through at least one transistor of the Schmitt trigger circuit and at least one transistor of the output buffer circuit; and means for forcing a known output onto the output terminal wherein means for forcing coupled to the output buffer circuit.

8. The Schmitt trigger cell of claim 7, wherein the Schmitt trigger circuit comprises:

an input terminal to receive an input signal and couple the input signal to gates of a first p channel transistor and a first n channel transistor, wherein the first p channel and first n channel transistors have their drain electrodes connected together at an output node;

a first potential divider to provide a low threshold reference potential on the source of the first p channel transistor, the first potential divider comprising second and third p channel transistors with their sources connected to the source of the first p channel transistor, wherein the gate of the third p channel transistor is connected to the output node; and a second potential divider to provide a high threshold reference potential on the source of the first n channel transistor, the second potential divider comprising second and third n channel transistors with their sources connected to the source of the first n channel transistor, wherein the gate of the third n channel transistor is connected to the output node.

9. The Schmitt trigger cell of claim 7, wherein the output buffer circuit comprises:

a level shifter connected to the input of the output buffer circuit to receive the output of the Schmitt trigger circuit; and a buffer inverter to receive an output from the level shifter and to provide an output on the output terminal.

10. The Schmitt trigger cell of claim 9, wherein the level shifter comprises a pair of series connected inverters.

11. In a integrated circuit Schmitt trigger cell having an input terminal and an output terminal, a method of disabling the Schmitt trigger cell during conditions of unknown gate voltages, the method comprising:

disabling current flow through those transistors of the Schmitt trigger cell whose gate voltages are unknown; and forcing a known output onto the output terminal.

* * * * *